United States Patent
Bryant

(10) Patent No.: US 9,634,609 B2
(45) Date of Patent: Apr. 25, 2017

(54) SWITCHING CIRCUIT

(71) Applicant: MEDIATEK Singapore Pte. Ltd, Singapore (SG)

(72) Inventor: Carl Bryant, Maidstone (GB)

(73) Assignee: MediaTek Singapore Pte. Ltd, Solaris (SG)

( * ) Notice: Subject to any disclaimer, the term of this patent is extended or adjusted under 35 U.S.C. 154(b) by 0 days.

(21) Appl. No.: 14/946,937

(22) Filed: Nov. 20, 2015

(65) Prior Publication Data

US 2016/0181981 A1   Jun. 23, 2016

Related U.S. Application Data

(60) Provisional application No. 62/094,130, filed on Dec. 19, 2014.

(51) Int. Cl.
  *H03D 7/14* (2006.01)
  *H03D 7/16* (2006.01)
  *H03K 17/687* (2006.01)

(52) U.S. Cl.
  CPC ......... *H03D 7/1441* (2013.01); *H03D 7/1458* (2013.01); *H03D 7/165* (2013.01); *H03K 17/687* (2013.01)

(58) Field of Classification Search
  CPC .. H03D 7/1458; H03D 7/1466; H03D 7/1475; H03D 7/1483; H03D 7/1491
  USPC .................. 327/355–360; 455/323, 326, 363
  See application file for complete search history.

(56) References Cited

U.S. PATENT DOCUMENTS

| | | | |
|---|---|---|---|
| 6,370,372 B1 | 4/2002 | Molnar et al. | |
| 8,004,342 B2 | 8/2011 | Huang | |
| 8,521,221 B2 * | 8/2013 | Lu .................. | H04B 1/0053 330/252 |
| 2004/0121751 A1 | 6/2004 | Shen | |
| 2009/0252252 A1 | 10/2009 | Kim et al. | |
| 2011/0095807 A1 | 4/2011 | DeJong et al. | |
| 2013/0135029 A1 | 5/2013 | Xu et al. | |

OTHER PUBLICATIONS

Dimitris F. G. Papadopoulos, Qiuting Huang Advanced Circuit Pursuit, Zollikon, Switzerland ETH, Zurich, Switzerland.
(Continued)

*Primary Examiner* — Dinh T Le
(74) *Attorney, Agent, or Firm* — Optimus Patents US, LLC

(57) ABSTRACT

There is provided a switching circuit for an active mixer. The switching circuit comprises a first pair of parallel switching devices and a second pair of parallel switching devices. The first and second pairs of parallel switching devices are arranged in a stacked configuration between an input node at which an input current comprising a first input frequency signal is received and a pair of differential output nodes. The first pair of switching devices are controlled by a second input frequency signal. The second pair of switching devices are controlled by a phase-shifted counterpart of the second input frequency signal. A common node between the first switching devices of the first and second pairs of switching devices is electrically coupled to a common node between the second switching devices of the first and second pairs of switching devices.

16 Claims, 7 Drawing Sheets

(56) References Cited

OTHER PUBLICATIONS

A 0.55 mW SAW-Less Receiver Front-End for Bluetooth Low Energy Applications Carl Bryant, Member, IEEE, and Henrik Sjöland, Senior Member, IEEE.
Sheng L et al; "A Si/SiGe HBT sub-harmonic mixer/downconverter", Bipolar/BICMOS Circuits and Technology Meeting, 1999. Proceeding of the 1999 Minneapolis, MN, USA Sep. 26-28, 1999, Piscataway, NJ, USA, IEEE, US, Sep. 26, 1999 (Sep. 26, 1999), pp. 71-74, XP010359527, DOI: 10.1109/BIPOL.1999.803529 ISBN: 978-0-7803-5712-9 *figure 2*.

* cited by examiner

SWITCHING CIRCUIT

FIELD OF THE INVENTION

This invention relates to a switching circuit, and in particular to a switching circuit for an active mixer.

BACKGROUND OF THE INVENTION

In the field of radio frequency (RF) transmitters, mixers are used to convert a low frequency baseband or intermediate frequency up to an RF frequency. Distortion introduced by the mixer may lead to corruption of the fundamental signal, and to unwanted spectral components at other frequencies that may cause involuntary interference to other transmitter units. It is therefore important to minimise the distortion introduced by the mixer.

FIG. 1 illustrates an example of a conventional active mixer structure 100. Active mixers are capable of gain (unlike passive mixers) and use an amplifying device to ensure a required signal strength of the product signal. They also provide good isolation between the input and output ports. Specifically, FIG. 1 illustrates a double balanced mixer. Advantageously, a double balanced mixer has symmetrical paths for both inputs, so that neither of the input signals appears at the output.

The active mixer structure 100 illustrated in FIG. 1 consists of a transconductance stage 110 consisting of two transistor devices $M_{m1}$ and $M_{m2}$. The transistor devices $M_{m1,2}$ are arranged to receive a first (differential) input frequency voltage signal $(\pm)u_{mi}$ and to convert the received frequency voltage signal $u_{mi}$ into (differential) input currents $i_{o1,2}$ having a frequency $\omega_b$ equal to that of the received input frequency voltage signal $u_{mi}$. The active mixer structure 100 illustrated in FIG. 1 further consists of a switching stage 120 consisting of two pairs of switching transistor devices $M_{sw1a,1b}$ and $M_{sw2a,2b}$. The switching transistor devices $M_{sw1a,1b,2a,2b}$ multiply the input currents $i_{o1,2}$ with a second (differential) input frequency voltage signal $u_{p,n}$, having a frequency $\omega_{LO}$, to form differential output currents $i_{M1,2}$. Isolation transistor devices $M_{B1,2}$ are provided between the transconductance stage 110 and switching stage 120 to improve the output impedance and isolation, making the transconductance stage 110 more of an ideal transconductor.

In Dimitrios Papadopoulos' 2008 dissertation entitled "*A Power Efficient Linear Multi-Mode CMOS radio Transmitter*", Dimitrios Papadopoulos identifies that the distortion introduced by the switching stage 120 of such a double balanced mixer structure may be divided into two types: static overlap distortion (SOD) and dynamic switching distortion (DSD).

FIG. 2 illustrates a first pair of switching transistor devices $M_{sw\_1a,1b}$ of the switching stage 120. For SOD, the case without parasitic capacitance $C_s$ at the input node of the switching stage 120 is considered. FIG. 3 illustrates a graph showing the cause of SOD within the first pair of switching transistor devices $M_{sw\_1a,1b}$ of the switching stage 120. In an ideal circuit, the switching transistor devices $M_{sw\_1a,1b}$ switch instantaneously, with only one switching transistor device $M_{sw\_1a,1b}$ within the pair being 'on' at any one time. However, in practice the switching transistor devices $M_{sw\_1a,1b}$ are not capable of switching instantaneously, resulting in periods of overlap when both switching transistor devices $M_{sw\_1a,1b}$ within the pair are 'on' simultaneously. As illustrated in FIG. 3, when the switching pair transition from $M_{sw\_1a,1b}$ being on to $M_{sw\_1a,1b}$ being on, because the input frequency voltage signal $u_{p,n}$ has a finite slope, a period of overlap occurs when both of the switching transistor devices $M_{sw\_1a,1b}$ are on. When both switches are on during such a period of overlap, the input current $i_{o1}$ is divided between the output currents $i_{MP,N}$, introducing distortion within the output currents $i_{MP,N}$ in the form of a non-instantaneous, non-linear transition of the output current $i_M (i_M=i_{MN}-i_{MP})$ from $+i_{O1}$ to $-i_{O1}$.

For DSD, the case with parasitic capacitance $C_s$ at the input node of the switching stage 120 is considered, which represents the gate-source and source-bulk capacitances of the switching transistor devices $M_{sw\_1a,1b}$ of the switching stage 120, and the drain-bulk capacitance of the isolation transistor device $M_{B1}$ (FIG. 1) below the first pair of switching transistor devices $M_{sw\_1a,1b}$. FIG. 4 illustrates graphs showing the cause of DSD within the first pair of switching transistor devices $M_{sw\_1a,1b}$ of the switching stage 120. As illustrated in FIG. 4, in order for the switching pair to fully switch from one side to the other, it is unavoidable that a voltage swing $u_s$ (illustrated in the upper graph of FIG. 4) is generated at the common source node S (FIG. 2) between the switching transistor devices $M_{sw\_1a,1b}$. The voltage $u_s$ causes a current to flow through the parasitic capacitance Cs that is dependent on the input signal $i_{o1}$ and on device non-linearity, resulting in distortion current flowing through the first pair of switching transistor devices $M_{sw\_1a,1b}$.

In his dissertation, Dimitrios Papadopoulos quantifies the DSD by modelling the pair of switching transistor devices $M_{sw\_1a,1b}$ as a single combined source-follower, with transitions happening at twice the switching frequency ($2\omega_{LO}$), illustrated in FIG. 5. As can be seen from this model, the distortion currents that flow through the capacitance $C_s$ at $2\omega_{LO}$ combine with the input current $i_{o1}$, resulting in cross-products that generate distortion currents at harmonics around $2\omega_{LO}\pm n^*\omega_b$.

In the mixer (FIG. 1), these distortion current harmonics are mixed with the frequency $\omega_{LO}$ of the second (differential) input frequency voltage signal $u_{p,n}$. Accordingly, the distortion currents at harmonics around $2\omega_{LO}\pm n^*\omega_b$ become down-converted to the frequency of the mixer's fundamental output signal: $\omega_{LO}\pm n^*\omega_b$.

Thus, there is a need to minimize the effects of SOD and DSD on the output currents $i_{M1,2}$ of the active mixer structure 100.

In his dissertation, Dimitrios Papadopoulos proposes 'coping' with the effects of SOD and DSD by introducing a switch Q between the two switching pairs, which closes for a very short interval during the overlap period of the switching transistor devices $M_{sw\_1a,1b}$. In this manner, the switch Q briefly forces the currents $i_{o3}$ and $i_{o4}$ to be equal, thereby 'quenching' the differential current at the output during the overlap period. However, a problem with this solution is in generating the quenching signals, which need to be very concise and timed correctly (the delay needs to be either close to zero, or carefully synchronised) so as to only affect the overlap period. As long as the quenching devices are active, they will short circuit the mixer, and if they are on for longer than necessary it will noticeably deteriorate the mixer operation (reduced gain). Generating such a quenching signal in practice is difficult, and the circuits used to generate such a signal would typically have high power consumption.

SUMMARY OF THE INVENTION

In accordance with a first aspect of the present invention, there is provided a switching circuit for an active mixer. The switching circuit comprises a first pair of switching devices $M_{1a}$, $M_{1b}$ and a second pair of switching devices $M_{2a}$, $M_{2b}$. The first and second pairs of switching devices are arranged such that:

a first switching device $M_{1a}$ of the first pair of switching devices is operably coupled in series with a first switching device $M_{2a}$ of the second pair of switching devices between an input node of the switching circuit at which an input current comprising a first input frequency signal is received and a first of a pair of differential output nodes of the switching circuit;

a second switching device $M_{1b}$ of the first pair of switching devices is operably coupled in series with a second switching device $M_{2b}$ of the second pair of switching devices between the input node of the switching circuit and a second of the pair of differential output nodes of the switching circuit, the first pair of switching devices $M_{1a}$, $M_{1b}$ are controlled by a second input frequency signal, the second input frequency signal comprising a differential signal pair, and the first and second switching devices $M_{1a}$, $M_{1b}$ of the first pair of switching devices are controlled by respective complementary signal components of the differential signal pair of the second input frequency signal;

the second pair of switching devices $M_{2a}$, $M_{2b}$ are controlled by a phase-shifted counterpart of the second input frequency signal, and the first and second switching devices $M_{2a}$, $M_{2b}$ of the second pair of switching devices are controlled by respective complementary signal components of a differential signal pair of the phase shifted counterpart of the second input frequency signal; and a common node between the first switching devices $M_{1a}$, $M_{2a}$ of the first and second pairs of switching devices is electrically coupled to a common node between the second switching devices $M_{1b}$, $M_{2b}$ of the first and second pairs of switching devices.

In this manner, and as described in greater detail below, by stacking two pairs of switching devices in this manner, and electrically coupling the common node between the first switching devices of each pair to the common node between the second switching devices of each pair, the effect of DSD products on the (wanted) fundamental output signal of the mixer is significantly reduced.

In an optional embodiment of the present invention, the common node between the first switching devices $M_{1a}$, $M_{2a}$ of the first and second pair of switching devices may be electrically coupled to the common node between the second switching devices $M_{1b}$, $M_{2b}$ of the first and second pair of switching devices by a capacitance $C_p$.

In an optional embodiment of the present invention, the capacitance $C_p$ may comprise a capacitive value greater than a parasitic capacitance $C_s$ at the input node of the switching circuit.

In an optional embodiment of the present invention, the phase-shifted counterpart of the second input frequency signal may be 90° phase-shifted relative to the second input frequency signal.

In accordance with a second aspect of the present invention there is provided an active mixer circuit comprising a transconductance stage and a switching stage. The transconductance stage is arranged to receive a first input frequency signal, and to apply the first input frequency signal to at least one input current of the switching stage. The switching stage comprises at least a first switching circuit comprising a first pair of switching devices $M_{1a}$, $M_{1b}$ and a second pair of switching devices $M_{2a}$, $M_{2b}$. The first and second pairs of switching devices are arranged such that:

a first switching device $M_{1a}$ of the first pair of switching devices is operably coupled in series with a first switching device $M_{2a}$ of the second pair of switching devices, between an input node of the switching stage at which the at least one input current is received and a first of a pair of differential output nodes of the switching stage;

a second switching device $M_{1b}$ of the first pair of switching devices is operably coupled in series with a second switching device $M_{2b}$ of the second pair of switching devices, between the input node of the switching stage and a second of the pair of differential output nodes of the switching stage;

the first pair of switching devices $M_{1a}$, $M_{1b}$ are controlled by a second input frequency signal, the second input frequency signal comprising a differential signal pair, and the first and second switching devices $M_{1a}$, $M_{1b}$ of the first pair of switching devices are controlled by respective complementary signal components of the differential signal pair of the second input frequency signal;

the second pair of switching devices $M_{2a}$, $M_{2b}$ are controlled by a phase-shifted counterpart of the second input frequency signal, and the first and second switching devices $M_{2a}$, $M_{2b}$ of the second pair of switching devices are controlled by respective complementary signal components of a differential signal pair of the phase shifted counterpart of the second input frequency signal; and a common node between the first switching devices $M_{1a}$, $M_{2a}$ of the first and second pair of switching devices is electrically coupled to a common node between the second switching devices $M_{1b}$, $M_{2b}$ of the first and second pair of switching devices.

In an optional embodiment of the present invention, the switching stage may comprise a second switching circuit comprising a first pair of switching devices $M'_{1a}$, $M'_{1b}$ and a second pair of switching devices $M'_{2a}$, $M_{2b}$. The first and second pairs of switching devices of the second switching circuit may be arranged such that:

a first switching device $M'_{1a}$ of the first pair of switching devices is operably coupled in series with a first switching device $M'_{2a}$ of the second pair of switching devices, between the input node of the switching stage and the second of the pair of differential output nodes of the switching stage;

a second switching device $M'_{1b}$ of the first pair of switching devices is operably coupled in series with a second switching device $M'_{2b}$ of the second pair of switching devices, between the input node of the switching stage and the first of the pair of differential output nodes of the switching stage;

the first pair of switching devices $M'_{1b}$ are controlled by the second input frequency signal, the first switching device $M'_{1a}$ of the first pair of switching devices of the second switching circuit being controlled by the same complementary signal component of the differential signal pair of the second input frequency signal as the first switching device $M_{1a}$ of the first pair of switching devices of the first switching circuit, and the second switching device $M'_{1b}$ of the first pair of switching devices of the second switching circuit being controlled by the same complementary signal component of the differential signal pair of the second input frequency signal as the second switching device $M_{1b}$ of the first pair of switching devices of the first switching circuit;

the second pair of switching devices $M'_{2a}$, $M'_{2b}$ are controlled by the phase-shifted counterpart of the second input frequency signal, the first switching device $M'_{2a}$ of the second pair of switching devices of the second switching circuit being controlled by the same complementary signal component of the differential signal pair of the phase-shifted counterpart of the second input frequency signal as the first switching device $M_{2a}$ of the second pair of switching devices of the first switching circuit, and the second switching device $M'_{2b}$ of the second pair of switching devices of the second switching circuit being controlled by the same complementary signal component of the differential signal pair of the phase-shifted counterpart of the second input frequency signal as the second switching device $M_{2b}$ of the second pair of switching devices of the first switching circuit; and a common node between the first switching devices $M'_{1a}$, $M'_{2a}$ of the first and second pair of switching devices of the second switching circuit is electrically coupled to a common node between the second switching devices $M'_{1b}$, $M'_{2b}$ of the first and second pair of switching devices of the second switching circuit.

In accordance with a third aspect of the present invention, there is provided an integrated circuit device comprising at least one active mixer circuit. The at least one active mixer circuit comprises a transconductance stage and a switching stage. The transconductance stage is arranged to receive a first input frequency signal, and to apply the first input frequency signal to at least one input current of the switching stage. The switching stage comprises at least a first switching circuit comprising a first pair of switching devices $M_{1a}$, $M_{1b}$ and a second pair of switching devices $M_{2a}$, $M_{2b}$. The first and second pairs of switching devices are arranged such that:

a first switching device $M_{1a}$ of the first pair of switching devices is operably coupled in series with a first switching device $M_{2a}$ of the second pair of switching devices, between an input node of the switching stage at which the at least one input current is received and a first of a pair of differential output nodes of the switching stage;

a second switching device $M_{1b}$ of the first pair of switching devices is operably coupled in series with a second switching device $M_{2b}$ of the second pair of switching devices, between the input node of the switching stage and a second of the pair of differential output nodes of the switching stage;

the first pair of switching devices $M_{1a}$, $M_{1b}$ are controlled by a second input frequency signal, the second input frequency signal comprising a differential signal pair, and the first and second switching devices $M_{1a}$, $M_{1b}$ of the first pair of switching devices are controlled by respective complementary signal components of the differential signal pair of the second input frequency signal;

the second pair of switching devices $M_{2a}$, $M_{2b}$ are controlled by a phase-shifted counterpart of the second input frequency signal, and the first and second switching devices $M_{2a}$, $M_{2b}$ of the second pair of switching devices are controlled by respective complementary signal components of a differential signal pair of the phase shifted counterpart of the second input frequency signal; and a common node between the first switching devices $M_{1a}$, $M_{2a}$ of the first and second pair of switching devices is electrically coupled to a common node between the second switching devices $M_{1b}$, $M_{2b}$ of the first and second pair of switching devices.

In accordance with a fourth aspect of the present invention, there is provided a method of providing a mixing signal by at least one active mixer circuit. The at least one active mixer circuit comprises a transconductance stage and a switching stage. The switching stage comprises at least a first switching circuit comprising a first pair of switching devices $M_{1a}$, $M_{1b}$ and a second pair of switching devices $M_{2a}$, $M_n$. The method comprises:

receiving a first input frequency signal by the transconductance stage, and applying the first input frequency signal to at least one input current of the switching stage;

turning on a first switching device $M_{1a}$ of the first pair of switching devices and a first switching device $M_{2a}$ of the second pair of switching devices, making the at least one input current flowing through the first switching device $M_{1a}$ of the first pair of switching devices and the first switching device $M_{2a}$ of the second pair of switching devices, and thus a corresponding resultant output current is driven at a first differential output node;

turning on a second switching device $M_{1b}$ of the first pair of switching devices and the first switching device $M_{2a}$ of the second pair of switching devices, making the at least one input current flowing through the second switching device $M_{1b}$ of the first pair of switching devices and the first switching device $M_{2a}$ of the second pair of switching devices pair, and thus a corresponding resultant output current is driven at the first differential output node;

turning on the second switching device $M_{1b}$ of the first pair of switching devices and a second switching device $M_{2b}$ of the second pair of switching devices, making the input current flowing through the second switching device $M_{1b}$ of the first pair of switching devices and the second switching device $M_{2b}$ of the second pair of switching devices, and thus a corresponding resultant output current is driven at a second differential output node; and turning on the first switching device $M_{1a}$ of the first pair of switching devices and the second switching device $M_{2b}$ of the second pair of switching devices, making the input current flowing through the first switching device $M_{1a}$ of the first pair of switching devices and the second switching device $M_n$ of the second pair of switching devices, and thus a corresponding resultant output current is driven at the second differential output node.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the Figures are illustrated for simplicity and clarity and have not necessarily been drawn to scale.

DETAILED DESCRIPTION OF THE PREFERRED EMBODIMENTS

According to examples of the present invention, there is provided a switching circuit for an active mixer. The switching circuit comprises a first pair of parallel switching devices and a second pair of parallel switching devices. The first and second pairs of parallel switching devices are arranged in a stacked configuration between an input node at which an input current comprising a first input frequency signal is received and a pair of differential output nodes. The first pair of switching devices are controlled by a second input frequency signal. The second pair of switching devices are controlled by a phase-shifted counterpart of the second input frequency signal. A common node between the first switching devices of the first and second pairs of switching devices is electrically coupled to a common node between the second switching devices of the first and second pairs of switching devices.

Advantageously, by stacking two pairs of switching devices in this manner, and electrically coupling the common node between the first switching devices of each pair to the common node between the second switching devices of each pair, the effect of DSD products on the (wanted) fundamental output signal of the mixer is significantly reduced. More specifically, and as described in greater detail below, with such a stacked configuration four transitions occur during a single cycle of the second input frequency voltage signal, as opposed to just two transitions in the case of a conventional switching stage. Consequently, the distortion currents occur at harmonics around $4\omega_{LO} \pm n^*\omega_b$, as opposed to at $2\omega_{LO} \pm n^*\omega_b$ as in the prior art, and in particular become down-converted to $3\omega_{LO} \pm n^*\omega_b$, and not to the frequency of the fundamental output signal of the mixer: $\omega_{LO} \pm n^*\psi_b$. As a result, the effect of the DSD products on the (wanted) fundamental output signal of the mixer is significantly reduced.

Figure 6:
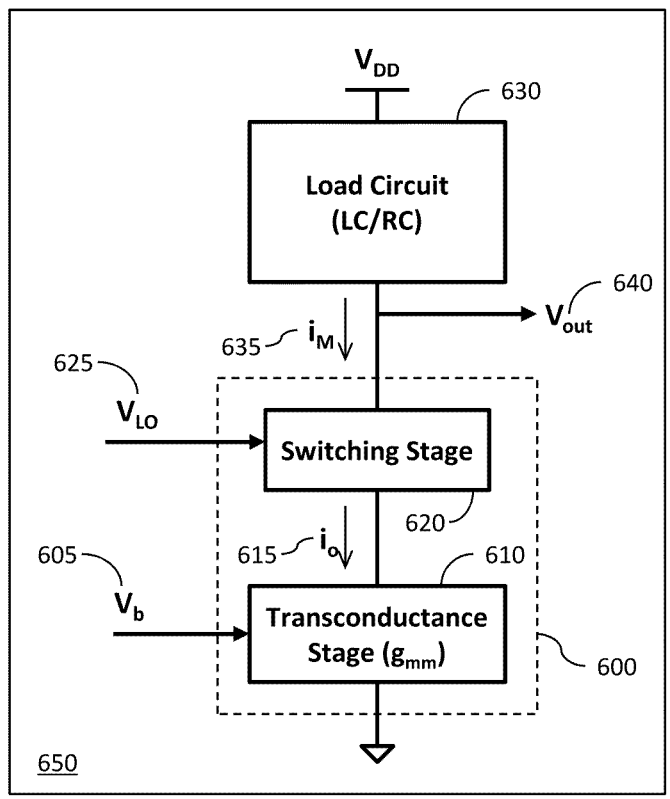
FIG. 6 illustrates a simplified block diagram of an example of an active mixer.

Referring now to FIG. 6, there is illustrated a simplified block diagram of an example of an active mixer 600. The active mixer 600 comprises a transconductance stage 610, which in the illustrated example comprises a transconductance stage. The transconductance stage 610 is arranged to receive a first input frequency voltage signal $V_b$ 605 and to convert the received frequency voltage signal $V_b$ 605 into a input current signal $i_o$ 615 having a frequency $\omega_b$ equal to that of the received input frequency voltage signal $V_b$ 605. The active mixer circuit comprises a switching stage 620. The switching stage 620 is arranged to receive a second input frequency voltage signal $V_{LO}$ 625 and to multiply the input current signal $i_o$ 615 with the second input frequency voltage signal $V_{LO}$ 625 to form an output current $i_M$ 635 at an output of the active mixer 600. The output of the active mixer 600 provides an output signal $V_{out}$ 640. In the example illustrated in FIG. 6, the output of the active mixer 600 is coupled to a load circuit 630, for example an LC tank or RC oscillator circuit, and is implemented within an integrated circuit device 650.

Figure 1:
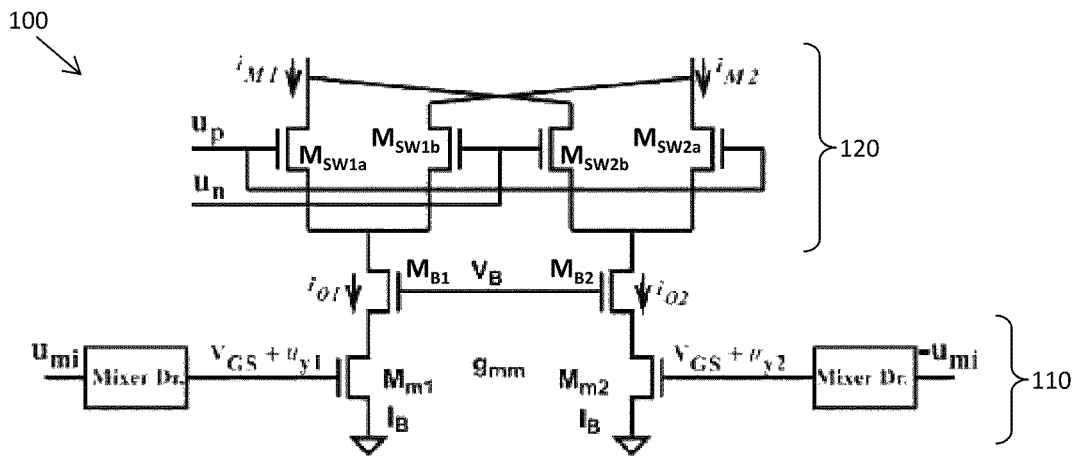
FIG. 1 illustrates an example of a conventional active mixer structure.
Figure 7:
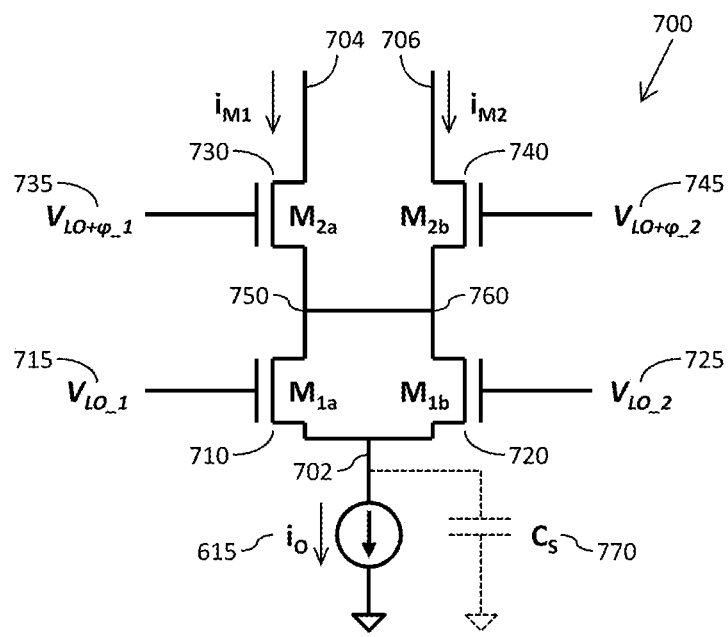
FIG. 7 illustrates a simplified circuit diagram of an example of a switching circuit.

FIG. 7 illustrates a simplified circuit diagram of an example of a switching circuit 700 for the switching stage 620 of the active mixer 600 of FIG. 6. The switching circuit 700 comprises an input node 702 at which the input current signal $i_o$ 615 having a frequency $\omega_b$ equal to that of a first input frequency voltage signal (the first input frequency voltage signal $V_b$ 605 in FIG. 1) is received, and a pair of differential output nodes 704, 706 of the switching circuit 700.

The switching circuit further comprises a first pair of switching devices $M_{1a}$, $M_{1b}$ 710, 720, and a second pair of switching devices $M_{2a}$, $M_{2b}$ 730, 740. The first and second pairs of switching devices 710-740 are arranged in a stacked configuration such that: a first switching device $M_{1a}$ 710 of the first pair of switching devices is operably coupled in series with a first switching device $M_{2a}$ 730 of the second pair of switching devices between the input node 702 and a first of the differential output nodes 704; and a second switching device $M_{1b}$ 720 of the first pair of switching devices is operably coupled in series with a second switching device $M_{2b}$ 740 of the second pair of switching devices between the input node 702 and a second of the differential output nodes 706.

The switching circuit 700 is arranged to receive a second input frequency voltage signal (e.g. the second input frequency voltage signal $V_{LO}$ 625 in FIG. 6) and to multiply the input current signal $i_o$ 615 with the received second input frequency voltage signal to form a differential output current (current $i_M$ 635 in FIG. 6) at the output nodes 704, 706.

In the example illustrated in FIG. 7, the second input frequency voltage signal comprises a differential signal pair $V_{LO\_1}$, $V_{LO\_2}$ 715, 725. The first pair of switching devices $M_{1a}$, $M_{1b}$ 710, 720 are controlled by respective complementary signal components 715, 725 of the differential second input frequency signal. In the illustrated example, the first pair of switching devices $M_{1a}$, $M_{1b}$ 710, 720 are implemented using field effect transistor devices, with the complementary signal components 715, 725 being provided to switching devices $M_{2a}$, $M_{2b}$ 730, 740 are controlled by respective complementary signal components 735, 745 of a phase-shifted counterpart of the differential second input frequency signal. In the illustrated example, the second pair of switching devices $M2_a$, $M_{2b}$ 730, 740 are also implemented using field effect transistor devices, with the complementary signal components 735, 745 being provided to gate terminals of the switching devices $M_{2a}$, $M_{2b}$ 730, 740 respectively.

A common node 750 between the first switching devices $M_{1a}$, $M_{2a}$ 710, 730 of the first and second pairs of switching devices is electrically coupled to a common node 760 between the second switching devices $M_{1b}$, $M_{2b}$ 720, 740 of the first and second pairs of switching devices.

Figure 8:
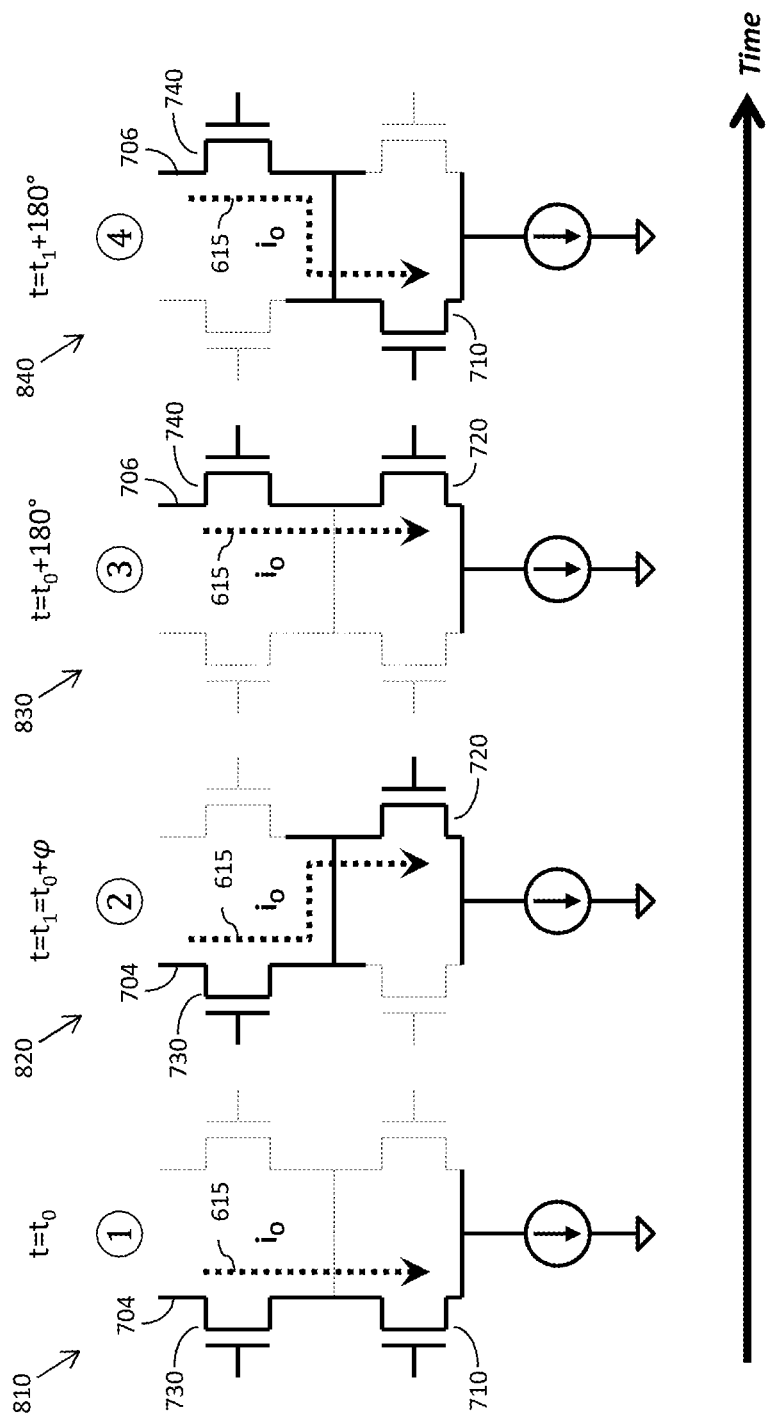
FIG. 8 illustrates a sequence of operating states of the switching circuit of FIG. 7.

FIG. 8 illustrates a sequence of operating states of the switching circuit 700 of FIG. 7 during a single cycle of the second input frequency voltage signal $V_{LO}$.

In a first operating state 810, occurring at time t=$t_0$, the first switching device $M_{1a}$ 710 of the first switching pair and the first switching device $M_{2a}$ 730 of the second switching pair are on. In this manner, the input current signal $i_o$ 615 flows through the first switching device $M_{1a}$ 710 of the first switching pair and the first switching device $M_{2a}$ 730, and thus a corresponding resultant output current is driven at the first differential output node 704.

Between the first operating state 810 and a second operating state 820 occurring at time t=$t_1$=$t_0$+φ (φ being the amount by which the phase-shifted counterpart of the differential second input frequency signal is shifted in phase relative to the second input frequency signal $V_{LO}$), a transition occurs within the first pair of switching devices whereby the first switching device $M_{1a}$ 710 of the first switching pair turns off and the second switching device $M_{1b}$ 720 of the first switching pair turns on. Accordingly, in the second operating state 820, the second switching device $M_{1b}$ 720 of the first switching pair and the first switching device $M_{2a}$ 730 of the second switching pair are on. In this manner, the input current signal $i_o$ 615 flows through the second switching device $M_{1b}$ 720 of the first switching pair and the first switching device $M_{2a}$ 730 of the second switching pair, and thus a corresponding resultant output current is still driven at the first differential output node 704.

Between the second operating state 820 and a third operating state 830 occurring at time t=$t_0$+180°, a transition occurs within the second pair of switching devices whereby the first switching device $M_{2a}$ 730 of the second switching pair turns off and the second switching device $M_{2b}$ 740 of the second switching pair turns on. Accordingly, in the third operating state 830, the second switching device $M_{1b}$ 720 of the first switching pair and the second switching device $M_{2b}$ 740 of the second switching pair are on. In this manner, the input current signal $i_o$ 615 flows through the second switching device $M_{1b}$ 720 of the first switching pair and the second switching device $M_{2b}$ 740 of the second switching pair, and thus a corresponding resultant output current is now driven at the second differential output node 706.

Between the third operating state 830 and a fourth operating state 840 occurring at time t=$t_1$+180°, a transition occurs within the first pair of switching devices whereby the first switching device $M_{1a}$ 710 of the first switching pair turns on and the second switching device $M_{1b}$ 720 of the first switching pair turns off. Accordingly, in the fourth operating state 840, the first switching device $M_{1a}$ 710 of the first switching pair and the second switching device $M_{2b}$ 740 of the second switching pair are on. In this manner, the input current signal 615 flows through the first switching device $M_{1a}$ 710 of the first switching pair and the second switching device $M_{2b}$ 740 of the second switching pair, and thus a corresponding resultant output current is still driven at the second differential output node 706.

Between the fourth operating state 840 and the first operating state 810 of the following cycle occurring at time t=$t_0'$=$t_0$+360°, a transition occurs within the second pair of switching devices whereby the first switching device $M_{2a}$ 730 of the second switching pair turns on and the second switching device $M_{2b}$ 740 of the second switching pair turns off. Accordingly, in the first operating state 810, the first switching device $M_{1a}$ 710 of the first switching pair and the first switching device $M_{2a}$ 730 of the second switching pair are once again both on. In this manner, the input current signal $i_o$ 615 again flows through the first switching device $M_{1a}$ 720 of the first switching pair and the first switching device $M_{2a}$ 730 of the second switching pair, and thus a corresponding resultant output current is again driven at the first differential output node 704.

As illustrated in FIG. 8, during a single cycle of the second input frequency voltage signal $V_{LO}$, four transitions occur within the switching circuit 700 of FIG. 7.

Figure 9:
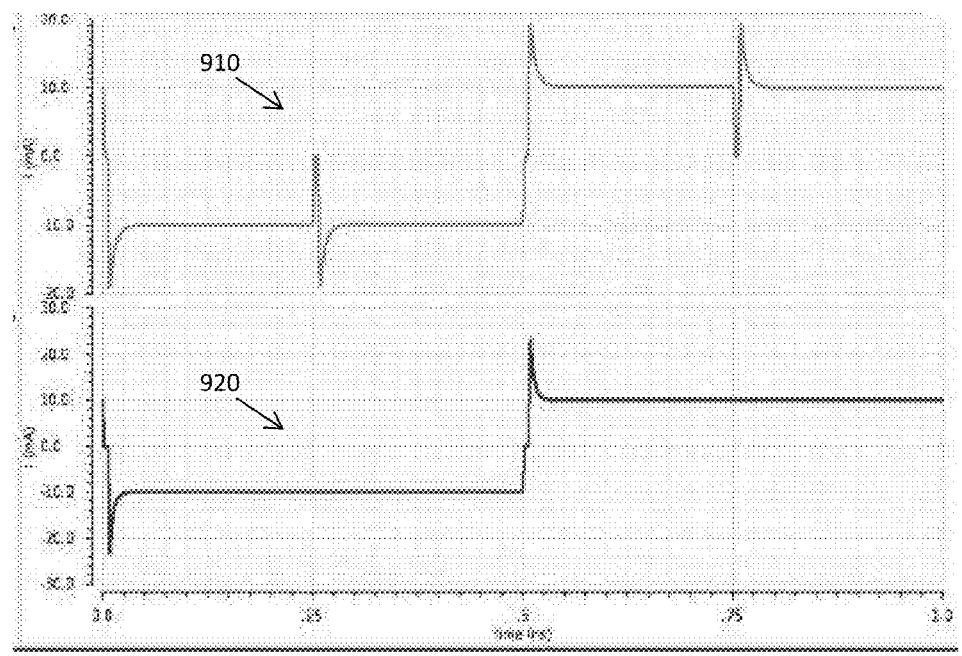
FIG. 9 illustrates graphs showing output current over time for the switching circuit of FIG. 7.

FIG. 9 illustrates graphs showing (differential) output current over time during a single cycle of the second input frequency voltage signal $V_{LO}$ for the switching circuit 700 of FIG. 7 (graph 910) and for a conventional switching stage circuit (graph 920). As previously mentioned in relation to FIG. 8, for the switching circuit 700 illustrated in FIG. 7, four transitions occur during a single cycle of the second input frequency voltage signal $V_{LO}$. This is in contrast to a conventional switching stage circuit within which only two transitions occur during a single cycle of the second input frequency voltage signal $V_{LO}$.

Figure 2:
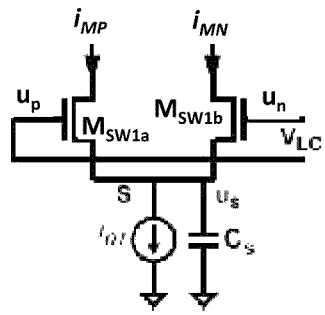
FIG. 2 illustrates a first pair of switching transistor devices $M_{sw\_1a,1b}$ of the switching stage of the conventional active mixer structure of FIG. 1.
Figure 5:
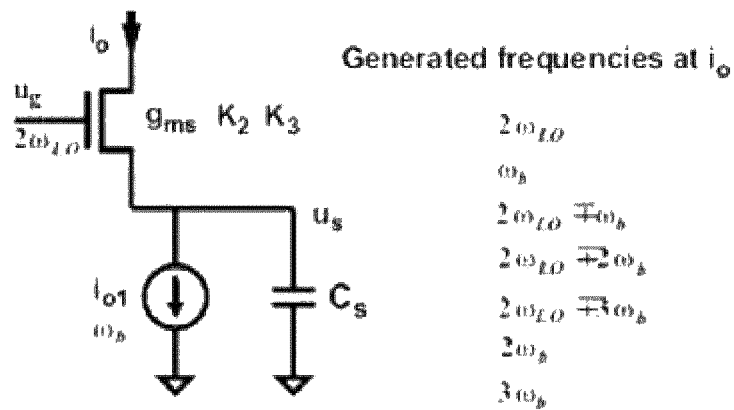
FIG. 5 illustrates the pair of switching transistor devices $M_{sw\_1a,1b}$ modelled as a single combined source-follower.

As described above in the background of the invention, for dynamic switching distortion (DSD), Dimitrios Papadopoulos quantifies DSD within the conventional switching stage 120 illustrated in FIG. 2 by modelling the switching transistor devices $M_{sw\_1a,1b}$ as a single combined source-follower model, with transitions happening at twice the switching frequency ($2\omega_{LO}$), illustrated in FIG. 5. As a result, when the distortion currents flowing through the capacitance $C_s$ at $2\omega_{LO}$ combine with the input current $i_{o1}$, cross-products are produced that generate distortion currents at harmonics around $2\omega_{LO}\pm n^*\omega_b$. In the active mixer illustrated in FIG. 1, these distortion current harmonics are mixed with the frequency $\omega_{LO}$ of the second (differential) input frequency voltage signal $u_{p,n}$. Accordingly, the distortion currents at harmonics around $2\omega_{LO}\pm n^*\omega_b$ become down-converted to the frequency of the mixer's fundamental output signal: $\omega_{LO}\pm n^*\omega_b$.

By contrast, for the switching circuit 700 illustrated in FIG. 7, four transitions occur during a single cycle of the second input frequency voltage signal $V_{LO}$, as opposed to just two transitions in the case of the conventional switching stage 120 illustrated in FIG. 2. Accordingly, the switching circuit 700 illustrated in FIG. 7 may be modelled as a single combined source-follower model with transitions happening at four times the switching frequency ($4\omega_{LO}$). As a result, when the distortion currents flowing through parasitic capacitance $C_s$ (770 in FIG. 7) at $4\omega_{LO}$ combine with the input current $i_{o1}$, cross-products are produced that generate distortion currents at harmonics around $4\omega_{LO}\pm n^*\omega_b$. These distortion current harmonics are mixed with the frequency $\omega_{LO}$ of the second (differential) input frequency voltage signal $V_{LO}$. Significantly, the distortion currents at harmonics around $4\omega_{LO}\pm n^*\omega_b$ become down-converted to $3\omega_{LO}\pm n^*\omega_b$, and not to the frequency of the fundamental output signal of the mixer: $\omega_{LO}\pm n^*\omega_b$. As a result, the DSD distortion currents do not contribute to the frequency of the fundamental output signal of the mixer, and as such the effect of the DSD products on the (wanted) fundamental output signal of the mixer is significantly reduced.

In some examples, the phase-shifted counterpart 735, 745 of the differential second input frequency signal is phase-shifted with respect to the second input frequency signal 715, 725 by 90°, thereby resulting in four substantially evenly spaced transitions each cycle of the second input frequency signal $V_{LO}$ 715, 715, thereby optimising the suppression of the effect of the DSD products on the (wanted) fundamental output signal of the mixer is significantly reduced.

The present invention is not limited to the phase-shifted counterpart 735, 745 of the differential second input frequency signal being phase shifted by 90° relative to the second input frequency signal 715, 725, and the effect of the DSD products on the (wanted) fundamental output signal of the mixer would be reduced with the phase-shifted counterpart 735, 745 of the differential second input frequency signal being phase shifted by different amounts relative to the second input frequency signal 715, 725. However, a 90° phase-shift between the second input frequency signal and its phase-shifted counterpart provides the additional benefit of simplifying the generation of the signals, since within many applications, for example within a direct conversion transmitter, there would be a second, parallel mixer operating at a phase 90° apart from the first. As such, second input frequency signals phase-shifted by 90° would already be available, thereby alleviating the need to generate a further phase-shifted counterpart signal.

Figure 10:
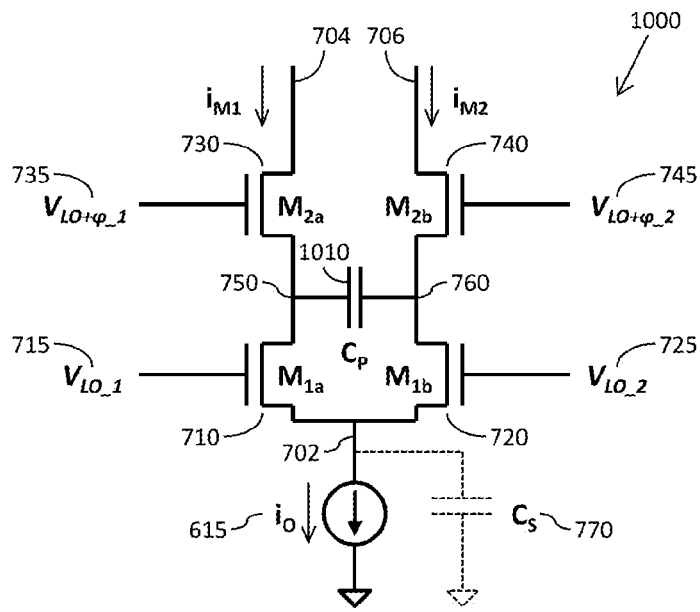
FIG. 10 illustrates a simplified circuit diagram of an alternative example of a switching circuit.

Referring now to FIG. 10, there is illustrated a simplified circuit diagram of an alternative example of a switching circuit 1000 for the switching stage 620 of the active mixer 600 of FIG. 6. For ease of understanding, elements of the switching circuit 1000 of FIG. 10 in common with the switching circuit 700 illustrated in FIG. 7 are designated with like reference numerals to the corresponding elements of the switching circuit 700.

The switching circuit 1000 of FIG. 10 differs from the switching circuit 700 illustrated in FIG. 7 in that the common node 750 between the first switching devices M1a, M2a 710, 730 of the first and second pairs of switching devices is electrically coupled to the common node 760 between the second switching devices M1b, M2b 720, 740 of the first and second pairs of switching devices by way of a capacitance $C_P$ 1010.

Figure 11:
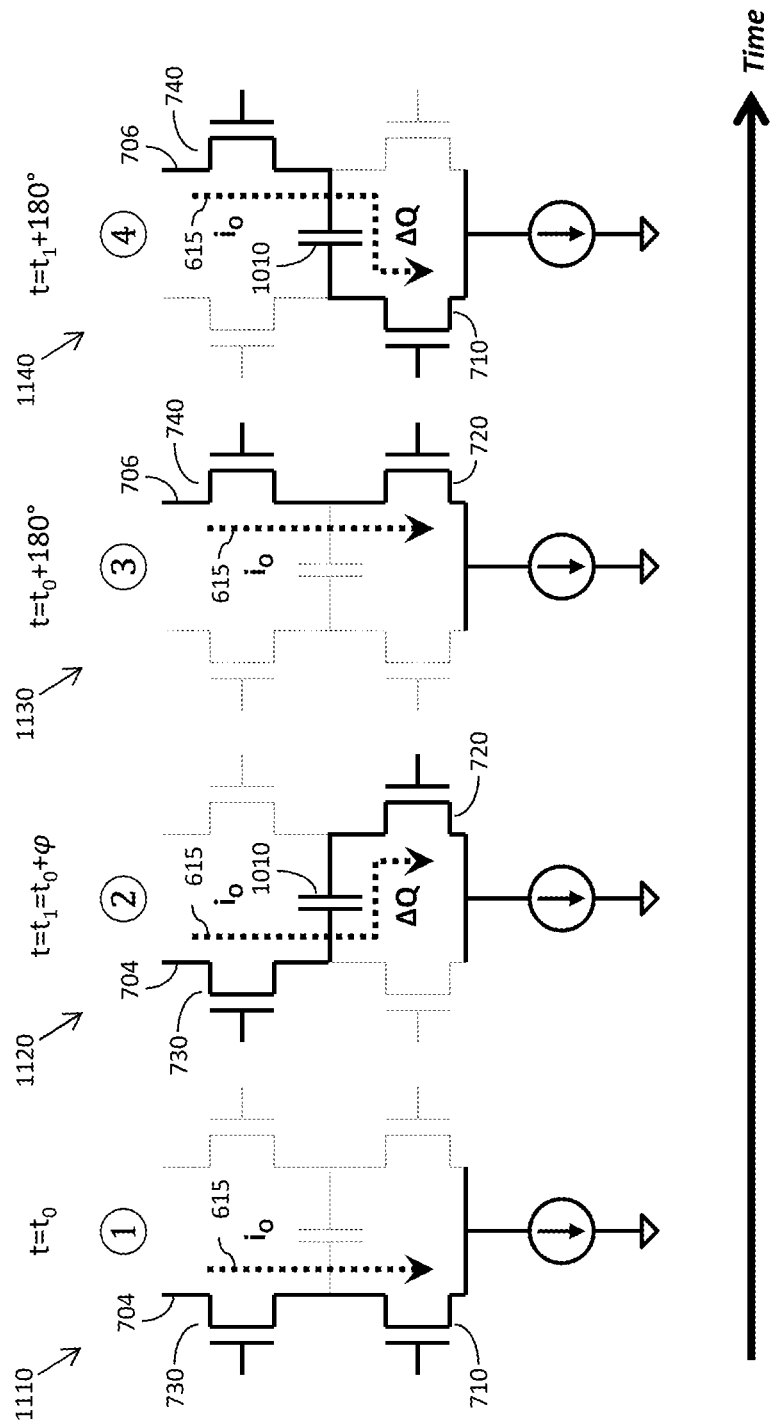
FIG. 11 illustrates a sequence of operating states of the switching circuit of FIG. 10.

FIG. 11 illustrates a sequence of operating states of the switching circuit 1000 of FIG. 10 during a single cycle of the second input frequency voltage signal $V_{LO}$.

In a first operating state 1110, occurring at time t=t$_0$, the first switching device M$_{1a}$ 710 of the first switching pair and the first switching device M$_{2a}$ 730 of the second switching pair are on. In this manner, the input current signal i$_o$ 615 flows through the first switching device M$_{1a}$ 710 of the first switching pair and the first switching device M$_{2a}$ 730, and thus a corresponding resultant output current is driven at the first differential output node 704.

Between the first operating state 1110 and a second operating state 1120 occurring at time t=t$_1$=t$_0$+ϕ (ϕ being the amount by which the phase-shifted counterpart of the differential second input frequency signal is shifted in phase relative to the second input frequency signal $V_{LO}$), a transition occurs within the first pair of switching devices whereby the first switching device M$_{1a}$ 710 of the first switching pair turns off and the second switching device M$_{1b}$ 720 of the first switching pair turns on. Accordingly, in the second operating state 1120, the second switching device M$_{1b}$ 720 of the first switching pair and the first switching device M$_{2a}$ 730 of the second switching pair are on. In this manner, the input current signal i$_o$ 615 flows through the second switching device M$_{1b}$ 720 of the first switching pair and the first switching device M$_{2a}$ 730 of the second switching pair, and thus a corresponding resultant output current is still driven at the first differential output node 704, charging the capacitance $C_P$ 1010 in a first direction.

Between the second operating state 1120 and a third operating state 1130 occurring at time t=t$_0$+180°, a transition occurs within the second pair of switching devices whereby the first switching device M$_{2a}$ 730 of the second switching pair turns off and the second switching device M$_{2b}$ 740 of the second switching pair turns on. Accordingly, in the third operating state 1130, the second switching device M$_{1b}$ 720 of the first switching pair and the second switching device M$_{2b}$ 740 of the second switching pair are on. In this manner, the input current signal i$_o$ 615 flows through the second switching device M$_{1b}$ 720 of the first switching pair and the second switching device M$_{2b}$ 740 of the second switching pair, and thus a corresponding resultant output current is now driven at the second differential output node 706.

Between the third operating state 1130 and a fourth operating state 1140 occurring at time t=t$_1$+180°, a transition occurs within the first pair of switching devices whereby the first switching device M$_{1a}$ 710 of the first switching pair turns on and the second switching device M$_{1b}$ 720 of the first switching pair turns off. Accordingly, in the fourth operating state 1140, the first switching device M$_{1a}$ 710 of the first switching pair and the second switching device M$_{2b}$ 740 of the second switching pair are on. In this manner, the input current signal i$_o$ 615 flows through the first switching device M$_{1a}$ 710 of the first switching pair and the second switching device M$_{2b}$ 740 of the second switching pair, and thus a corresponding resultant output current is still driven at the second differential output node 706, discharging and recharging the capacitance $C_P$ 1010 in a second direction.

Between the fourth operating state 1140 and the first operating state 1110 of the following cycle occurring at time t=t$_0$'=t$_0$=360°, a transition occurs within the second pair of switching devices whereby the first switching device M$_{2a}$ 730 of the second switching pair turns on and the second switching device M$_{2b}$ 740 of the second switching pair turns off. Accordingly, in the first operating state 1110, the first switching device M$_{1a}$ 710 of the first switching pair and the first switching device M$_{2a}$ 730 of the second switching pair are once again both on. In this manner, the input current signal i$_o$ 615 again flows through the first switching device M$_{1a}$ 720 of the first switching pair and the first switching device M$_{2a}$ 730 of the second switching pair, and thus a corresponding resultant output current is again driven at the first differential output node 704.

Figure 3:
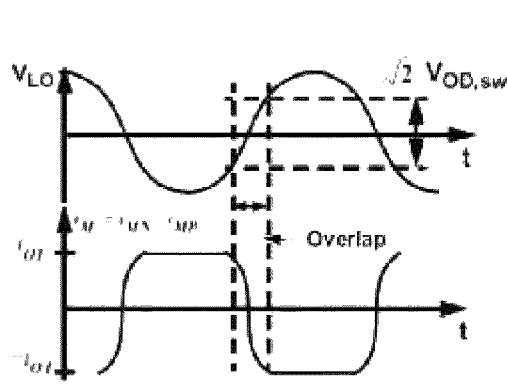
FIG. 3 illustrates a graph showing the cause of static overlap distortion (SOD) within the first pair of switching transistor devices $M_{sw\_1a,1b}$ of the switching stage.
Figure 4:
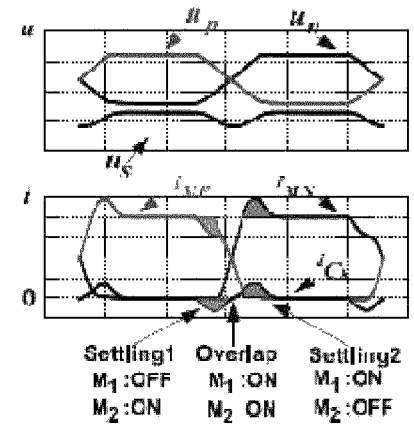
FIG. 4 illustrates graphs showing the cause of dynamic switching distortion (DSD) within the first pair of switching transistor devices $M_{sw\_1a,1b}$ of the switching stage.

As described in the background of the invention with reference to FIG. 3, static overlap distortion (SOD) is caused by periods of overlap when both switching transistor devices M$_{sw\_1a,1b}$ (FIG. 3) within the pair are on simultaneously. As illustrated in FIG. 3, when the switching pair transition from M$_{sw\_1a,1b}$ being on to M$_{sw\_1a,1b}$ being on, because the input frequency voltage signal u$_{p,n}$ has a finite slope, a period of overlap occurs when both of the switching transistor devices M$_{sw\_1a,1b}$ are on. When both switches are on during such a period of overlap, the input current i$_{o1}$ is divided between the output currents i$_{MP,N}$, introducing distortion within the output currents i$_{MP,N}$ in the form of a non-instantaneous, non-linear transition of the output current i$_M$ (i$_M$=i$_{MN}$−i$_{MP}$) from +i$_{o1}$ to −i$_{o1}$.

Referring back to FIG. 11, considering for a moment SOD resulting from the transition from the second operating state 1120 to the third operating state 1130, whereby the first switching device M$_{2a}$ 730 of the second switching pair turns off and the second switching device M$_{2b}$ 740 of the second switching pair turns on. Assuming the input current signal i$_o$ 615 is driven from a high impedance current source, the total current is kept constant. Thus the SOD distortion results ideally in a difference in charges ΔQ flowing through the first switching device $M_{2a}$ 730 of the second switching pair compared to the second switching device $M_{2b}$ 740 of the second switching pair during the transition. The distorted current from the event flows through the capacitance $C_P$ 1010, offsetting the amount by which the capacitance $C_P$ 1010 is charged by $\Delta Q$.

Consider next the transition from the fourth operating state 1140 to the first operating state 1110 (for the subsequent cycle), whereby the first switching device $M_{2a}$ 730 of the second switching pair turns on and the second switching device $M_{2b}$ 740 of the second switching pair turns off. Again, the SOD distortion results ideally in a difference in charges $\Delta Q$ flowing through the first switching device $M_{2a}$ 730 of the second switching pair compared to the second switching device $M_{2b}$ 740 of the second switching pair during the transition. This time the distorted current from the event flows in the opposite direction through the capacitance $C_P$ 1010, offsetting the amount by which the capacitance $C_P$ 1010 is charged by $-\Delta Q$, compensating for the corresponding offset charge from the transition within the second switching pair occurring between the second and third operating states 1120, 1230.

Thus, by providing the capacitance $C_P$ 1010 between the common nodes 750, 760, the distortion currents from SOD events can be compensated for, thereby reducing the effect of SOD within the switching circuit 1000.

For best performance, the capacitance $C_p$ 1010 should be sufficiently large to easily pass currents created in the capacitance Cs during a DSD event, without any noticeable impedance from the capacitance $C_p$ 1010. Accordingly, in some examples, the capacitance $C_p$ 1010 comprises a capacitive value greater than a parasitic capacitance $C_s$ at the input node 702 of the switching circuit 1000.

Figure 12:
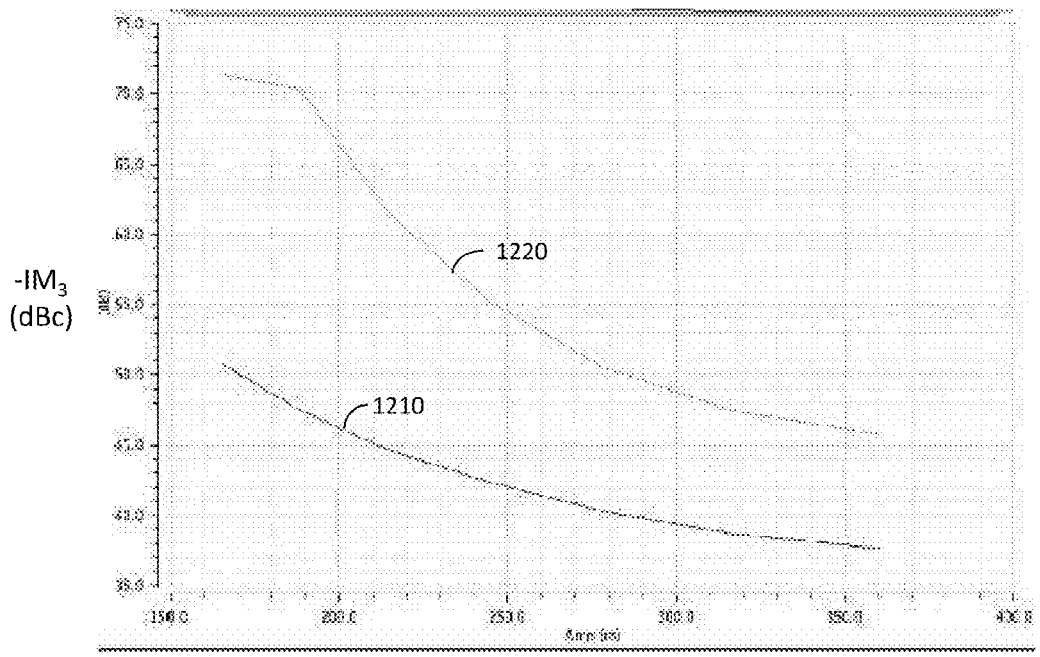
FIG. 12 illustrates a graph of third order intermodulation ($IM_3$) product levels relative to the carrier signal versus input amplitude.

FIG. 12 illustrates a graph of third order intermodulation ($IM_3$) product levels relative to the carrier signal, a standard measurement of distortion in RF circuits, versus input amplitude. The graph comprises a first plot 1210 showing $IM_3$ product levels versus amplitude for the conventional switching circuit of FIG. 2, and a second plot 1220 showing $IM_3$ product levels versus amplitude for the switching circuit of FIG. 10 adapted in accordance with an example of the present invention. The higher (negative) decibel $IM_3$ curve of the plot 1220 for the switching circuit of FIG. 10 illustrated in FIG. 12 shows the significant reduction in the $IM_3$ product levels relative to the carrier signal as compared with the conventional switching circuit.

Figure 13:
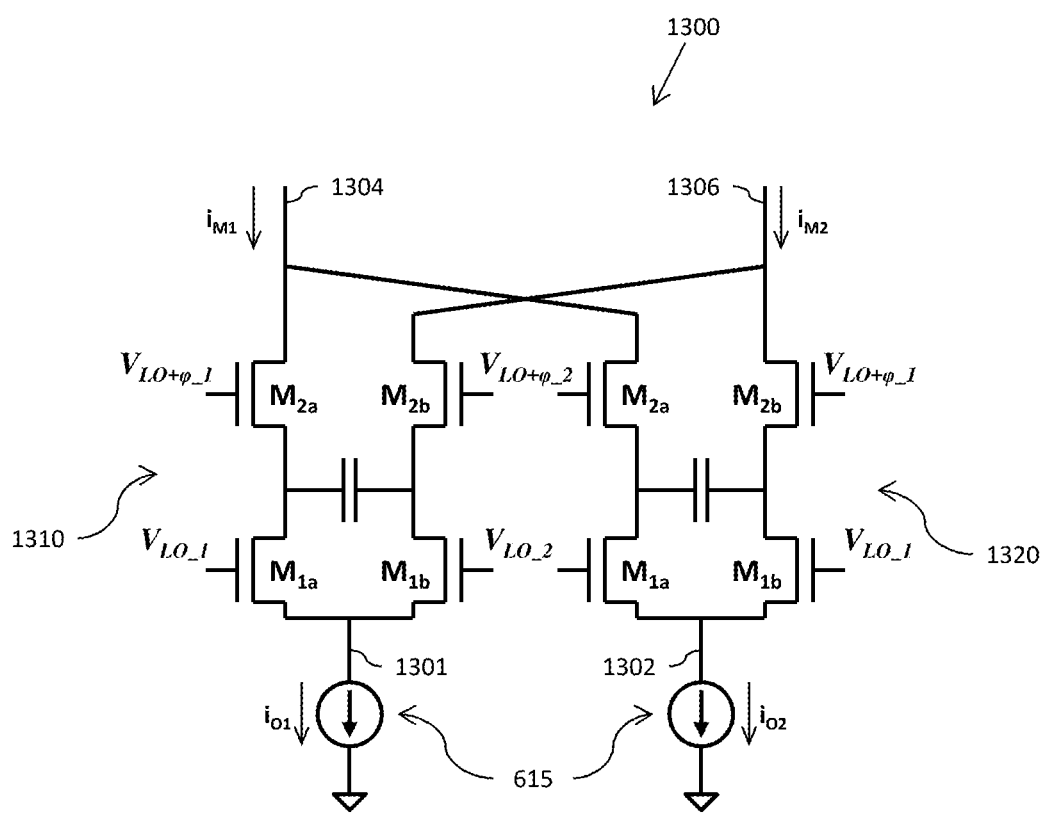
FIG. 13 illustrates a simplified circuit diagram of a further alternative example of a switching circuit.

Referring now to FIG. 13, there is illustrated a simplified circuit diagram of a further alternative example of a switching circuit 1300 for the switching stage 620 of the active mixer 600 of FIG. 6, wherein the active mixer 600 of FIG. 6 comprises a double balanced mixer. For the example illustrated in FIG. 13, the switching circuit 1300 comprises two input nodes 1301, 1302 at which differential components $i_{o1,o2}$ of the input current signal $i_o$ 615 are received, and a pair of differential output nodes 1304, 1306 of the switching circuit 1300. The switching circuit 1300 of FIG. 13 consists of two switching sub-circuits 1310, 1320; a first switching sub-circuit 1310 operably coupled between a first of the input nodes 1301 and the output nodes 1304, 1306, and a second switching sub-circuit 1320 operably coupled between a second of the input nodes 1302 and the output nodes 1304, 1306. In the example illustrated in FIG. 13, each of the switching sub-circuits 1310, 1320 comprises the switching circuit 1000 of FIG. 10. In an alternative example, each of the switching sub-circuits may comprise the switching circuit 700 of FIG. 7.

Because the illustrated embodiments of the present invention may for the most part, be implemented using electronic components and circuits known to those skilled in the art, details have not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific examples of embodiments of the invention. It will, however, be evident that various modifications and changes may be made therein without departing from the scope of the invention as set forth in the appended claims and that the claims are not limited to the specific examples described above.

Although specific conductivity types or polarity of potentials have been described in the examples, it will be appreciated that conductivity types and polarities of potentials may be reversed.

Other modifications, variations and alternatives are also possible without departing from the scope of the invention. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms 'a' or 'an,' as used herein, are defined as one or more than one. Also, the use of introductory phrases such as 'at least one' and 'one or more' in the claims should not be construed to imply that the introduction of another claim element by the indefinite articles 'a' or 'an' limits any particular claim containing such introduced claim element to inventions containing only one such element, even when the same claim includes the introductory phrases 'one or more' or 'at least one' and indefinite articles such as 'a' or 'an.' The same holds true for the use of definite articles. Unless stated otherwise, terms such as 'first' and 'second' are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

I claim:

1. A switching circuit for an active mixer; the switching circuit comprising a first pair of switching devices ($M_{1a}$, $M_{1b}$) and a second pair of switching devices ($M_{2a}$, $M_{2b}$), the first and second pairs of switching devices being arranged such that:

a first switching device ($M_{1a}$) of the first pair of switching devices is operably coupled in series with a first switching device ($M_{2a}$) of the second pair of switching devices between an input node of the switching circuit at which an input current comprising a first input frequency signal is received and a first of a pair of differential output nodes of the switching circuit;

a second switching device ($M_{1b}$) of the first pair of switching devices is operably coupled in series with a second switching device ($M_{2b}$) of the second pair of switching devices between the input node of the switching circuit and a second of the pair of differential output nodes of the switching circuit, the first pair of switching devices ($M_{1a}$, $M_{1b}$) are controlled by a second input frequency signal, the second input frequency signal comprising a differential signal pair, and the first and second switching devices ($M_{1a}$, $M_{1b}$) of the first pair of switching devices are controlled by respective complementary signal components of the differential signal pair of the second input frequency signal;

the second pair of switching devices ($M_{2a}$, $M_{2b}$) are controlled by a phase-shifted counterpart of the second input frequency signal, and the first and second switching devices ($M_{2a}$, $M_{2b}$) of the second pair of switching devices are controlled by respective complementary signal components of a differential signal pair of the phase shifted counterpart of the second input frequency signal; and a common node between the first switching devices ($M_{1a}$, $M_{2a}$) of the first and second pairs of switching devices is electrically coupled to a common node between the second switching devices ($M_{1b}$, $M_{2b}$) of the first and second pairs of switching devices.

2. The switching circuit of claim 1, wherein the common node between the first switching devices ($M_{1a}$, $M_{2a}$) of the first and second pair of switching devices is electrically coupled to the common node between the second switching devices ($M_{1b}$, $M_{2b}$) of the first and second pair of switching devices by a capacitance ($C_p$).

3. The switching circuit of claim 2, wherein the capacitance ($C_p$) comprises a capacitive value greater than a parasitic capacitance ($C_s$) at the input node of the switching circuit.

4. The switching circuit of claim 1, wherein the phase-shifted counterpart of the second input frequency signal is 90° phase-shifted relative to the second input frequency signal.

5. An active mixer circuit comprising a transconductance stage and a switching stage;

the transconductance stage is arranged to receive a first input frequency signal, and to apply the first input frequency signal to at least one input current of the switching stage;

the switching stage comprises at least a first switching circuit comprising a first pair of switching devices ($M_{1a}$, $M_{1b}$) and a second pair of switching devices ($M_{2a}$, $M_{2b}$), the first and second pairs of switching devices being arranged such that:

a first switching device ($M_{1a}$) of the first pair of switching devices is operably coupled in series with a first switching device ($M_{2a}$) of the second pair of switching devices, between an input node of the switching stage at which the at least one input current is received and a first of a pair of differential output nodes of the switching stage;

a second switching device ($M_{1b}$) of the first pair of switching devices is operably coupled in series with a second switching device ($M_{2b}$) of the second pair of switching devices, between the input node of the switching stage and a second of the pair of differential output nodes of the switching stage, the first pair of switching devices ($M_{1a}$, $M_{1b}$) are controlled by a second input frequency signal, the second input frequency signal comprising a differential signal pair, and the first and second switching devices ($M_{1a}$, $M_{1b}$) of the first pair of switching devices are controlled by respective complementary signal components of the differential signal pair of the second input frequency signal;

the second pair of switching devices ($M_{2a}$, $M_{2b}$) are controlled by a phase-shifted counterpart of the second input frequency signal, and the first and second switching devices ($M_{2a}$, $M_{2b}$) of the second pair of switching devices are controlled by respective complementary signal components of a differential signal pair of the phase shifted counterpart of the second input frequency signal; and a common node between the first switching devices ($M_{1a}$, $M_{2a}$) of the first and second pair of switching devices is electrically coupled to a common node between the second switching devices ($M_{1b}$, $M_{2b}$) of the first and second pair of switching devices.

6. The active mixer circuit of claim 5, wherein the common node between the first switching devices ($M_{1a}$, $M_{2a}$) of the first and second pair of switching devices is electrically coupled to the common node between the second switching devices ($M_{1b}$, $M_{2b}$) of the first and second pair of switching devices by a capacitance ($C_p$).

7. The active mixer circuit of claim 6, wherein the capacitance ($C_p$) comprises a capacitive value greater than a parasitic capacitance ($C_s$) at the input node of the switching stage.

8. The active mixer circuit of claim 5, wherein the phase-shifted counterpart of the second input frequency signal is 90° phase-shifted relative to the second input frequency signal.

9. The active mixer of claim 5, wherein the switching stage comprises a second switching circuit comprising a first pair of switching devices ($M'_{1a}$, $M'_{1b}$) and a second pair of switching devices ($M'_{2a}$, $M'_{2b}$), the first and second pairs of switching devices of the second switching circuit being arranged such that:

a first switching device ($M'_{1a}$) of the first pair of switching devices is operably coupled in series with a first switching device ($M'_{2a}$) of the second pair of switching devices, between the input node of the switching stage and the second of the pair of differential output nodes of the switching stage;

a second switching device ($M'_{1b}$) of the first pair of switching devices is operably coupled in series with a second switching device ($M'_{2b}$) of the second pair of switching devices, between the input node of the switching stage and the first of the pair of differential output nodes of the switching stage, the first pair of switching devices ($M'_{1a}$, $M'_{1b}$) are controlled by the second input frequency signal, the first switching device ($M'_{1a}$) of the first pair of switching devices of the second switching circuit being controlled by the same complementary signal component of the differential signal pair of the second input frequency signal as the first switching device ($M_{1a}$) of the first pair of switching devices of the first switching circuit, and the second switching device ($M'_{1b}$) of the first pair of switching devices of the second switching circuit being controlled by the same complementary signal component of the differential signal pair of the second input frequency signal as the second switching device ($M_{1b}$) of the first pair of switching devices of the first switching circuit;

the second pair of switching devices ($M'_{2a}$, $M'_{2b}$) are controlled by the phase-shifted counterpart of the second input frequency signal, the first switching device ($M'_{2a}$) of the second pair of switching devices of the second switching circuit being controlled by the same complementary signal component of the differential signal pair of the phase-shifted counterpart of the second input frequency signal as the first switching device ($M_{2a}$) of the second pair of switching devices of the first switching circuit, and the second switching device ($M'_{2b}$) of the second pair of switching devices of the second switching circuit being controlled by the same complementary signal component of the differential signal pair of the phase-shifted counterpart of the second input frequency signal as the second switching device ($M_{2b}$) of the second pair of switching devices of the first switching circuit; and a common node between the first switching devices ($M'_{1a}$, $M'_{2a}$) of the first and second pair of switching devices of the second switching circuit is electrically coupled to a common node between the second switching devices ($M'_{1b}$, $M'_{2b}$) of the first and second pair of switching devices of the second switching circuit.

10. An integrated circuit device comprising at least one active mixer circuit; the at least one active mixer circuit comprising a transconductance stage and a switching stage;

the transconductance stage is arranged to receive a first input frequency signal, and to apply the first input frequency signal to at least one input current of the switching stage;

the switching stage comprises at least a first switching circuit comprising a first pair of switching devices ($M_{1a}$, $M_{1b}$) and a second pair of switching devices ($M_{2a}$, $M_{2b}$), the first and second pairs of switching devices being arranged such that:

a first switching device ($M_{1a}$) of the first pair of switching devices is operably coupled in series with a first switching device ($M_{2a}$) of the second pair of switching devices, between an input node of the switching stage at which the at least one input current is received and a first of a pair of differential output nodes of the switching stage;

a second switching device ($M_{1b}$) of the first pair of switching devices is operably coupled in series with a second switching device ($M_{2b}$) of the second pair of switching devices, between the input node of the switching stage and a second of the pair of differential output nodes of the switching stage, the first pair of switching devices ($M_{1a}$, $M_{1b}$) are controlled by a second input frequency signal, the second input frequency signal comprising a differential signal pair, and the first and second switching devices ($M_{1a}$, $M_{1b}$) of the first pair of switching devices are controlled by respective complementary signal components of the differential signal pair of the second input frequency signal;

the second pair of switching devices ($M_{1a}$, $M_{2b}$) are controlled by a phase-shifted counterpart of the second input frequency signal, and the first and second switching devices ($M_{2a}$, $M_{2b}$) of the second pair of switching devices are controlled by respective complementary signal components of a differential signal pair of the phase shifted counterpart of the second input frequency signal; and a common node between the first switching devices ($M_{1a}$, $M_{2a}$) of the first and second pair of switching devices is electrically coupled to a common node between the second switching devices ($M_{1b}$, $M_{2b}$) of the first and second pair of switching devices.

11. The integrated circuit device of claim 10, wherein the common node between the first switching devices ($M_{1a}$, $M_{2a}$) of the first and second pair of switching devices is electrically coupled to the common node between the second switching devices ($M_{1b}$, $M_{2b}$) of the first and second pair of switching devices by a capacitance ($C_p$).

12. The integrated circuit device of claim 11, wherein the capacitance ($C_p$) comprises a capacitive value greater than a parasitic capacitance ($C_s$) at the input node of the switching stage.

13. The integrated circuit device of claim 10, wherein the phase-shifted counterpart of the second input frequency signal is 90° phase-shifted relative to the second input frequency signal.

14. The integrated circuit device of claim 10, wherein the switching stage comprises a second switching circuit comprising a first pair of switching devices ($M'_{1a}$, $M'_{1b}$) and a second pair of switching devices ($M'_{2a}$, $M'_{2b}$), the first and second pairs of switching devices of the second switching circuit being arranged such that:

a first switching device ($M'_{1a}$) of the first pair of switching devices is operably coupled in series with a first switching device ($M'_{2a}$) of the second pair of switching devices, between the input node of the switching stage and the second of the pair of differential output nodes of the switching stage;

a second switching device ($M'_{1b}$) of the first pair of switching devices is operably coupled in series with a second switching device ($M'_{2b}$) of the second pair of switching devices, between the input node of the switching stage and the first of the pair of differential output nodes of the switching stage, the first pair of switching devices ($M'_{1a}$, $M'_{1b}$) are controlled by the second input frequency signal, the first switching device ($M'_{1a}$) of the first pair of switching devices of the second switching circuit being controlled by the same complementary signal component of the differential signal pair of the second input frequency signal as the first switching device ($M_{1a}$) of the first pair of switching devices of the first switching circuit, and the second switching device ($M'_{1b}$) of the first pair of switching devices of the second switching circuit being controlled by the same complementary signal component of the differential signal pair of the second input frequency signal as the second switching device ($M_{1b}$) of the first pair of switching devices of the first switching circuit;

the second pair of switching devices ($M'_{2a}$, $M'_{2b}$) are controlled by the phase-shifted counterpart of the second input frequency signal, the first switching device ($M'_{2a}$) of the second pair of switching devices of the second switching circuit being controlled by the same complementary signal component of the differential signal pair of the phase-shifted counterpart of the second input frequency signal as the first switching device ($M_{2a}$) of the second pair of switching devices of the first switching circuit, and the second switching device ($M'_{2b}$) of the second pair of switching devices of the second switching circuit being controlled by the same complementary signal component of the differential signal pair of the phase-shifted counterpart of the second input frequency signal as the second switching device ($M_{2b}$) of the second pair of switching devices of the first switching circuit; and a common node between the first switching devices ($M'_{1a}$, $M'_{2a}$) of the first and second pair of switching devices of the second switching circuit is electrically coupled to a common node between the second switching devices ($M'_{1b}$, $M'_{2b}$) of the first and second pair of switching devices of the second switching circuit.

15. A method of providing a mixing signal by at least one active mixer circuit; the at least one active mixer circuit comprising a transconductance stage and a switching stage;

the switching stage comprising at least a first switching circuit comprising a first pair of switching devices ($M_{1a}$, $M_{1b}$) and a second pair of switching devices ($M_{2a}$, $M_{2b}$); the method comprising:

receiving a first input frequency signal by the transconductance stage, and applying the first input frequency signal to at least one input current of the switching stage;

turning on a first switching device ($M_{1a}$) of the first pair of switching devices and a first switching device ($M_{2a}$) of the second pair of switching devices, making the at least one input current flowing through the first switching device ($M_{1a}$) of the first pair of switching devices and the first switching device ($M_{2a}$) of the second pair of switching devices, and thus a corresponding resultant output current is driven at a first differential output node;

turning on a second switching device ($M_{1b}$) of the first pair of switching devices and the first switching device ($M_{2a}$) of the second pair of switching devices, making the at least one input current flowing through the second switching device ($M_{1b}$) of the first pair of switching devices and the first switching device ($M_{2a}$) of the second pair of switching devices pair, and thus a corresponding resultant output current is driven at the first differential output node;

turning on the second switching device ($M_{1b}$) of the first pair of switching devices and a second switching device ($M_{2b}$) of the second pair of switching devices, making the input current flowing through the second switching device ($M_{1b}$) of the first pair of switching devices and the second switching device ($M_{2b}$) of the second pair of switching devices, and thus a corresponding resultant output current is driven at a second differential output node; and turning on the first switching device ($M_{1a}$) of the first pair of switching devices and the second switching device ($M_{2b}$) of the second pair of switching devices, making the input current flowing through the first switching device ($M_{1a}$) of the first pair of switching devices and the second switching device ($M_{2b}$) of the second pair of switching devices, and thus a corresponding resultant output current is driven at the second differential output node.

16. The method of claim 15, wherein the first pair of switching devices ($M_{1a}$, $M_{1b}$) are controlled by a second input frequency signal, the second input frequency signal comprising a differential signal pair, and the first and second switching devices ($M_{1a}$, $M_{1b}$) of the first pair of switching devices are controlled by respective complementary signal components of the differential signal pair of the second input frequency signal; the second pair of switching devices ($M_{2a}$, $M_{2b}$) are controlled by a phase-shifted counterpart of the second input frequency signal, and the first and second switching devices ($M_{2a}$, $M_{2b}$) of the second pair of switching devices are controlled by respective complementary signal components of a differential signal pair of the phase shifted counterpart of the second input frequency signal.

* * * * *